(12) United States Patent
Layman et al.

(10) Patent No.: US 7,045,835 B2
(45) Date of Patent: May 16, 2006

(54) HIGH-DENSITY INTER-DIE INTERCONNECT STRUCTURE

(75) Inventors: Paul Arthur Layman, Orlando, FL (US); John Russell McMacken, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/638,248

(22) Filed: Aug. 8, 2003

(65) Prior Publication Data

US 2004/0026771 A1 Feb. 12, 2004

Related U.S. Application Data

(63) Continuation of application No. 09/950,387, filed on Sep. 10, 2001, now abandoned.

(51) Int. Cl.
*H01L 31/288* (2006.01)
*H01L 31/112* (2006.01)

(52) U.S. Cl. .................. 257/258; 257/252; 257/291

(58) Field of Classification Search ............. 257/252, 257/258, 291
See application file for complete search history.

(56) References Cited

U.S. PATENT DOCUMENTS

| | | | |
|---|---|---|---|
| 3,697,832 A | 10/1972 | Hanaoka | |
| 4,686,373 A | 8/1987 | Tew et al. | |
| 4,943,491 A | 7/1990 | Norton et al. | |
| 5,024,372 A | 6/1991 | Altman et al. | |
| 5,034,608 A | 7/1991 | Tavrow et al. | |
| 5,185,292 A | 2/1993 | VanVonno et al. | |
| 5,308,980 A | 5/1994 | Barton | |
| 5,376,558 A | * 12/1994 | Sudo et al. | ............ 438/59 |
| 5,400,950 A | 3/1995 | Myers et al. | |
| 5,449,944 A | * 9/1995 | Sudo et al. | ............ 257/446 |
| 5,517,029 A | 5/1996 | Yanka et al. | |
| 5,547,740 A | 8/1996 | Higdon et al. | |
| 5,726,500 A | 3/1998 | Duboz et al. | |
| 5,747,840 A | 5/1998 | Merrill | |
| 5,751,049 A | 5/1998 | Goodwin | |
| 5,844,289 A | 12/1998 | Teranishi et al. | |
| 5,859,450 A | 1/1999 | Clark et al. | |
| 5,898,223 A | 4/1999 | Frye et al. | |
| 5,920,345 A | 7/1999 | Sauer | |
| 6,001,667 A | 12/1999 | Saitoh et al. | |
| 6,043,525 A | 3/2000 | Chen | |
| 6,051,857 A | 4/2000 | Miida | |
| 6,130,423 A | 10/2000 | Brehmer et al. | |
| 6,137,164 A | 10/2000 | Yew et al. | |
| 6,150,724 A | 11/2000 | Wenzel et al. | |
| 6,179,200 B1 | 1/2001 | Kung et al. | |
| 6,188,056 B1 | 2/2001 | Kalnitsky et al. | |
| 6,239,482 B1 | 5/2001 | Fillion et al. | |
| 6,396,148 B1 | 5/2002 | Eichelberger et al. | |
| 6,407,440 B1 | 6/2002 | Rhodes | |
| 6,452,260 B1 | 9/2002 | Corbin et al. | |

FOREIGN PATENT DOCUMENTS

| | | |
|---|---|---|
| EP | 0 831 535 A1 | 3/1998 |
| FR | 2 718 570 A1 | 4/1994 |
| GB | 2 246 662 A | 2/1992 |

\* cited by examiner

*Primary Examiner*—Long Pham

(57) ABSTRACT

An interconnect architecture for connecting a plurality of closely-spaced electrical elements on a first integrated circuit fabricated structure with operative circuits on a second integrated circuit fabricated structure. In one embodiment, the first integrated circuit fabricated structure comprises a plurality of photo sensors. Conductive interconnect elements on the first integrated circuit fabricated structure provide electrical connection between individual photo sensors and the operative circuitry on the second integrated circuit fabricated structure.

2 Claims, 4 Drawing Sheets

HIGH-DENSITY INTER-DIE INTERCONNECT STRUCTURE

This patent is a continuation of and claims the benefit of the U.S. patent application filed on Sep. 10, 2001, and assigned application Ser. No. 09/950,387 now abandoned.

FIELD OF THE INVENTION

The present invention is directed to an interconnect structure for semiconductor die and, more specifically, the invention relates to an interconnect structure for die where the circuits on at least one die are separately and independently operable and closely spaced.

BACKGROUND OF THE INVENTION

Various types of imagers or image sensors are in use today, including charge-coupled device (CCD) image sensors and complementary metal-oxide semiconductor (CMOS) image sensors. These semiconductor-based image sensors are widely used in many image input devices because they can be mass produced using advanced fine-patterning lithographic techniques. Applications include digital cameras, computer peripherals for document capture, visual communications, and facsimile machines.

A CCD image sensor utilizes an array of photo sensors to form charge packets proportional to the received light intensity. These photo sensors are typically photo transistors or photo diodes located on the image sensor surface. Each charge packet constitutes a pixel of the composite image. The image data is read out from the CCD array by shifting these analog charge packets from the CCD array interior to the periphery in a pixel-by-pixel manner. To begin the readout process, the charges on the first row are transferred to a readout register and from there the signals are input to an amplifier and in most applications to an analog-to-digital converter. Once a row has been read, its charges on the readout register row are deleted. The next row then enters the readout register and all the rows above move down one row. In this way, each row is read, one row at a time. Because all the pixels in a row of pixels are read simultaneously, the pixels of the CCD array are not individually addressable.

Due to voltage, capacitance and process constraints, CCD arrays are not well suited to integration at the high levels of integration possible in CMOS integrated circuits. Hence, any supplemental signal processing circuitry required for the CCD image sensors (e.g., memory for storing information related to the sensor) is generally provided on one or more separate chips. As a result, the system cost and size are increased. It is also known that CCD image sensors require a large power consumption and higher operating voltages, as compared with conventional CMOS signal processing circuitry.

CMOS image sensors typically utilize an array of active pixel image sensors and a row or register of amplifiers to sample and hold the output of a given row of pixel image sensors. The principle of a CMOS pixel's operation is based on the modulation of a reverse biased an junction capacitance (of a diode, for example) due to impinging light. Photons absorbed in the depletion region of the reverse biased junction generate electron-hole pairs that discharge the reverse biased capacitance. Larger junctions collect more photons and are more sensitive to light, but larger junctions also reduce the resolution of a sensor because fewer pixels can be placed on the available surface area.

CMOS image sensors have several advantages over CCD image sensors. CMOS image sensors are formed with the same CMOS process technology used for the associated circuitry required to operate the CMOS image sensor and therefore the sensors and support circuitry are easily integratable into a single chip. Single chip integration eases miniaturization, lowers manufacturing costs, and boosts reliability. Using CMOS image sensors, it is possible to create a monolithic integrated circuit providing not only the sensor but also control logic and timing, image processing, and signal-processing circuitry. Thus the CMOS image sensors can be manufactured at lower cost, relative to CCD image sensors, using conventional CMOS integrated circuit fabrication processes. Also, the CMOS image sensors operate at a lower operating voltage and consume less power, allowing the system into which the sensors are incorporated to operate longer on batteries, which is a major advantage for hand-held imaging products. Finally, each CMOS image sensor is accessible over a grid of x-y lines, instead of using the shift register process of charged coupled devices. The column and row addressability of the CMOS image sensor, which is similar to the conventional RAM readout process, allows windowing of the image. CMOS image sensors require only a single power supply to drive both the image sensor and the associated circuitry. By contrast, CCD image sensors typically require three different input voltages. Also, CCD image sensors lack a consistent dark level voltage due to fabrication processing imperfections. CMOS image sensors are also known to exhibit inconsistent dark levels, but the associated CMOS signal processing circuitry can track the dark level for each CMOS image sensor and provide a compensation factor during the signal processing function so that a uniform dark level is achievable across the CMOS image sensor array.

However, CMOS image sensors are not without disadvantages. The use of state-of-the-art CMOS integrated circuit fabrication techniques for the associated signal processing circuitry, and the CMOS image sensor would compromise the construction of the CMOS photo sensors, thereby reducing the image signal quality. For example, typical substrate and source/drain doping levels (or retrograde doped tubs where the doping level at the surface is lower than the doping level below the surface) conventionally used in CMOS processes are higher than the doping levels that provide optimal image sensor quality. Reducing the doping levels to achieve better sensor sensitivity, dynamic range, or color balance, would significantly degrade the performance of the CMOS processing circuitry. Therefore, higher levels of component integration (i.e., image sensors and operative signal processing circuitry on the same chip) are therefore not practical.

Further, in those situations where the CMOS image sensor and its signal processing circuitry are co-located on the same integrated circuit, the associated circuits consume a portion of the available pixel area, resulting in a larger overall chip area and reducing the image fill factor (the ratio of the active pixel area to the total pixel area). The efficiency, resolution and sensitivity of the CMOS image sensor array is in turn disadvantageously reduced. Also, certain CMOS material layers (e.g., suicide layers) may be partially or completely opaque, reducing the image sensor sensitivity. In an effort to overcome the disadvantages created when using state-of-the-art CMOS process technology in conjunction with CMOS image sensors, certain modified CMOS processes have been created that remove processing steps or alter device physical characteristics to improve the image sensor signal quality. Although removal of these process steps improves image sensor signal quality, the CMOS technology is generally compromised. In summary, it can be said that state-of-the-art CMOS image sensor processing technology lags by several generations the current state of the CMOS processing art.

SUMMARY OF THE INVENTION

To overcome the disadvantages discussed above relative to the use of CMOS image sensors and associated CMOS operative circuitry, the present invention provides an interconnect system between a first integrated circuit structure having a plurality of image sensors fabricated therein and a second CMOS (or other integrated circuit type, for example, BiCMOS) integrated circuit structure having signal processing circuitry operative in conjunction with the image sensors. With the separation of the image sensor structure and the operative signal processing circuitry, the image sensor structure can be fabricated with processing techniques that are specifically optimized for the image sensors, and the signal processing circuitry can also be fabricated with uniquely optimal fabrication techniques and device characteristics. The interconnect system comprises electroless nickel plated bumps, solder bumps or other well-known die interconnect structures, especially fine pitch interconnect structures. The bumps are provided on the image sensor structure for interconnecting each image sensor or pixel element with its associated signal processing circuitry located on a separate structure. Mating die interconnect structures are also included on the signal processing circuitry for connection to each of the pixel elements of the image sensor structure. After fabrication of the two individual structures, the image sensor structure is bonded to the signal processing structure by way of the mating die interconnect structures. According to the teachings of the present invention, the use of separate image sensor and signal processing structures allows the functional characteristics and processing methodology of each structure to be optimized by use of the most favorable fabrication processing steps and device characteristics.

BRIEF DESCRIPTION OF THE DRAWINGS

The present invention can be more easily understood and the further advantageous and uses thereof more readily apparent, when considered in view of the description of the preferred embodiments and the following figures in which.

DESCRIPTION OF THE PREFERRED EMBODIMENTS

Figure 1:
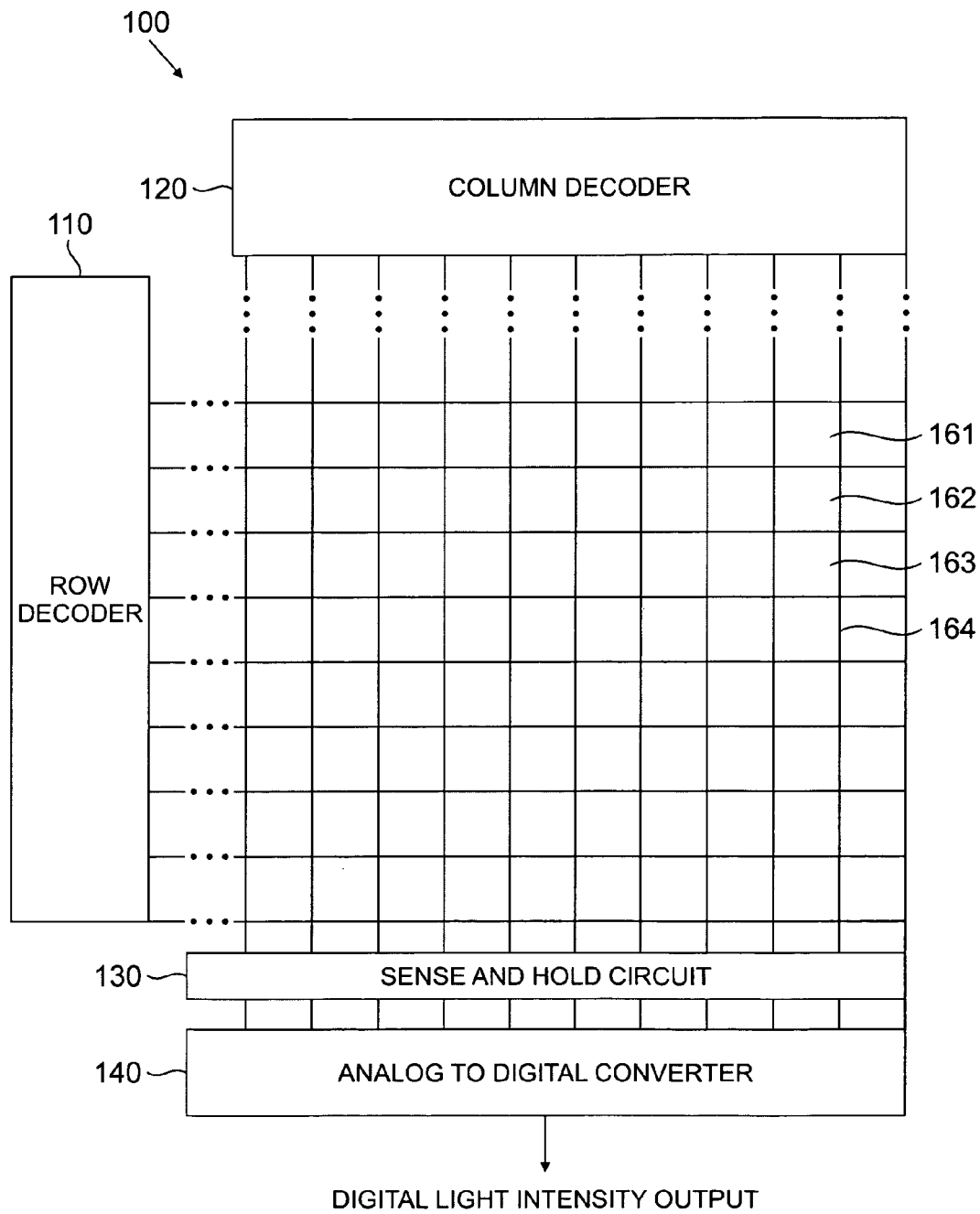
FIG. 1 illustrates a typical CMOS image sensor array.

The processing steps and hardware components of the present invention have been represented by conventional processes and elements in the drawings, showing only those specific details that are pertinent to the present invention so as not to obscure the disclosure with details that will be readily apparent to those skilled in the art having the benefit of the description herein. Exemplary device layers are not shown to scale. Like reference characters represent like structures elements throughout.

Bulk semiconductor materials can be used as photo conductors (also referred to as photo sensors or image sensors) based on the change in the semiconductor resistance as a function of the wavelength and intensity of the impinging light waves. Electrons in bound states in the valence band (for intrinsic semiconductor material) or in doping-determined energy levels within the forbidden band gap (for extrinsic semiconductor materials) absorb energy from the incident light photons and are excited into free states in the conduction band. The electrons remain in the excited state for a characteristic lifetime. The conduction of electrical current takes place as a result of movement of the electrons in the conduction band or movement of the positive holes formed in the valence band. The resistance of the semiconductor material is thus inversely proportional to the illumination and this resistance change is translated into a change in the current that flows through the device output circuit.

In lieu of simple semiconductor bulk photo sensors, photo sensor junction devices can be used to improve the speed of response and the sensitivity of the detector to optical radiation. Such two-terminal devices designed to respond to photon absorption are referred to as photodiodes. In a conventional reverse-biased diode, carriers generated within the depletion region drift away from the depletion region due to the electric field; electrons are therefore collected in the n region and holes in the p region. These carriers form the reverse current. Also, minority carriers generated thermally within a diffusion length of the edge of the transition region diffuse to the depletion region and are swept to the other side by the electric field. If the junction is also uniformly illuminated by photons having an energy greater than the semiconductor material band gap, then these electron-hole pairs also participate in the reverse current. This is the basic principle by which a reverse-biased diode detects light. Although electron-hole pairs are also generated outside the depletion region, they do not result in current flow.

Generally, a CMOS image sensor, to which the teachings of the present invention can be applied, is an integrated circuit that measures incident light by detecting a voltage change produced by a photo sensor. Specifically, a photo sensor is charged to a pre-determined voltage and then integrates the incident light, the result of which is a higher voltage across the device. The voltage value of the photo sensor is then read out by a readout circuit, wherein this voltage value is representative of the incident light.

FIG. 1 illustrates a block diagram of a conventional CMOS image sensor array 100. Each element in the array (such as array elements 161, 162 and 163) is an individual CMOS image sensor circuit, the details of which will be discussed below in conjunction with FIG. 2. The individual CMOS image sensor circuits are also referred to as pixel circuits or pixel elements.

The CMOS image sensor array 100 is controlled by a row decoder 110 and a column decoder 120, which are individually activated to select a specific CMOS image sensor circuit for activation. The output of the activated CMOS image sensor circuit is carried down a column output line 164 to a sense and hold circuit 130. The sense and hold circuit 130 senses the voltage value of the activated CMOS image sensor circuit. Finally, the sensed voltage value is converted to a digital value by an analog to digital converter 140. The output signal from the analog to digital converter 140 is a digital signal representative of the light intensity.

A CMOS image sensor array, such as the array 100, is similar to a dynamic random access memory array except that instead of individual memory cells that are set and later read out, a CMOS image sensor array has individual CMOS image sensor circuits that are set to an initial voltage value and then sensed after exposure to incident light. Furthermore a CMOS image sensor array differs from a dynamic random access array in that analog values are stored within each CMOS image sensor and then quantized by conversion in the analog to digital converter 140.

Figure 2:
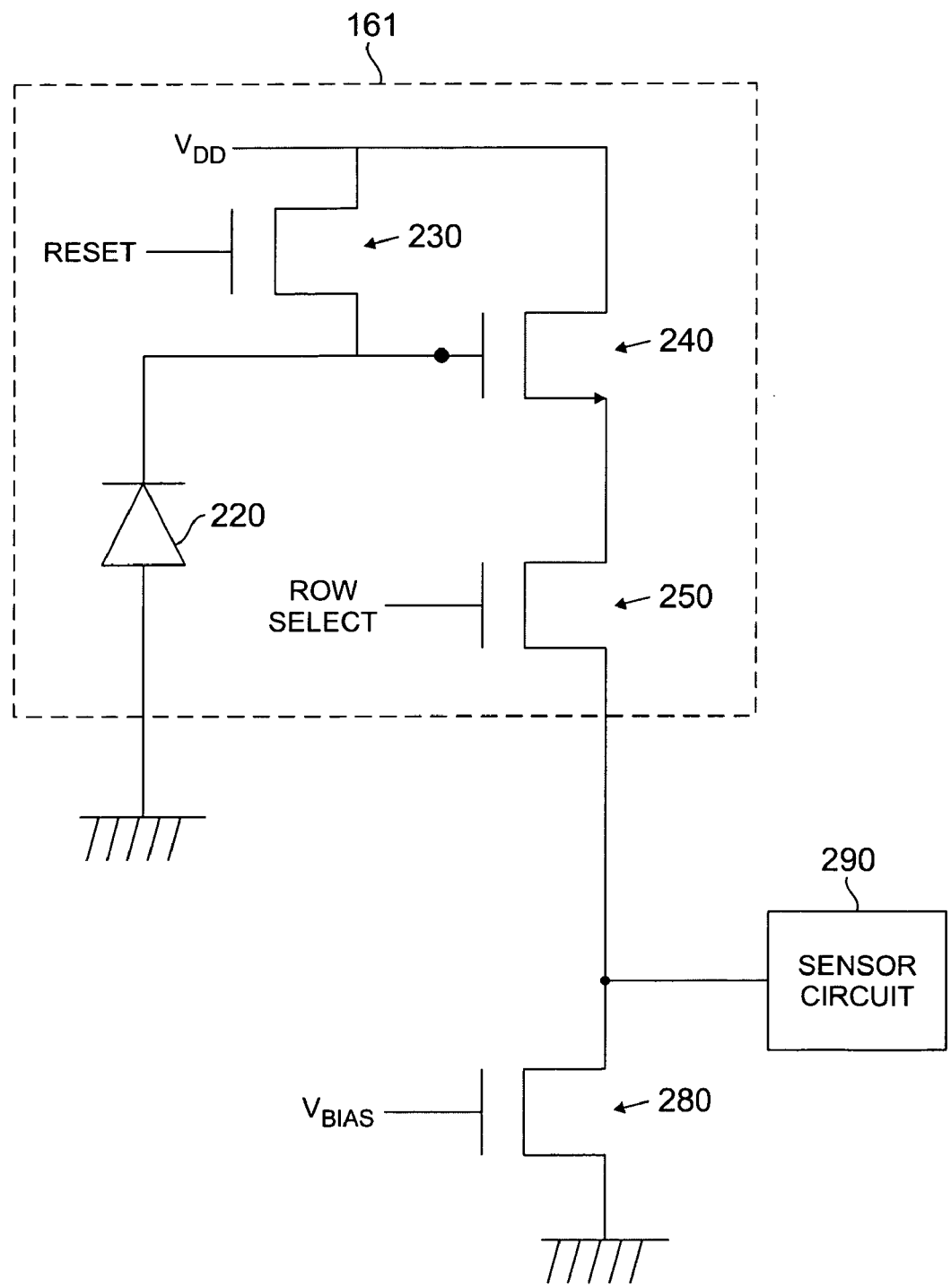
FIG. 2 illustrates a prior art CMOS image sensor circuit.

FIG. 2 illustrates an exemplary CMOS image sense circuit 161, comprising a reset transistor 230, a photo sensor 220, a source follower transistor 240 and a row select transistor 250. Also illustrated in FIG. 2 is an exemplary output circuit for processing the output signal of the CMOS image sense circuit 161. In particular, the output circuit comprises a current source transistor 280 and a sensor circuit 290.

Figure 3:
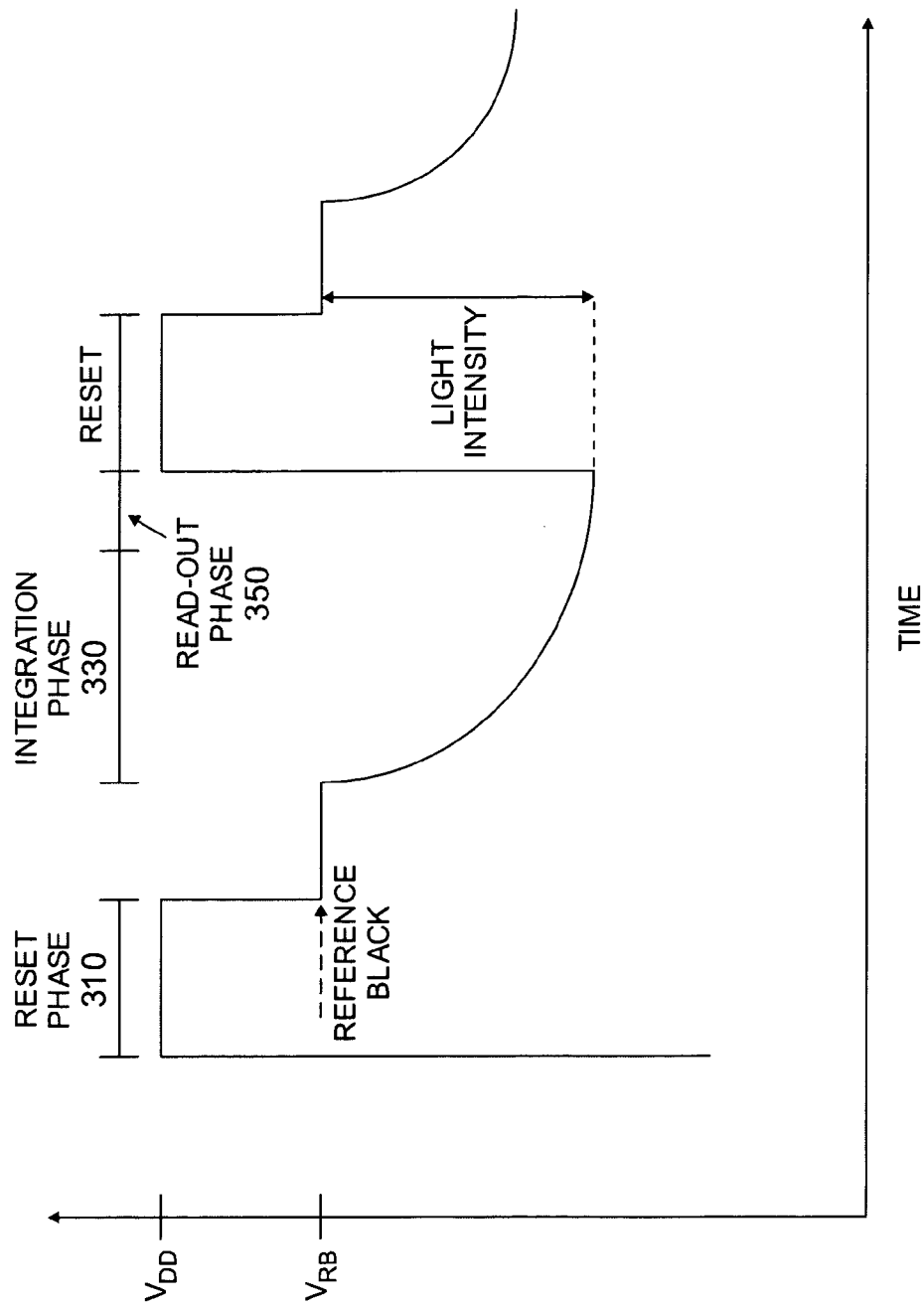
FIG. 3 is a time line showing the operational phases of the CMOS image sensor circuit of FIG. 2.

The CMOS image sense circuit 161 operates in three different phases: reset, integration and readout. The operational phases of the CMOS image sense circuit 161 are described below with reference to FIG. 3, which displays the gate voltage of the source follower transistor 240 during operation of the CMOS image sense circuit 161.

Initially, during a reset phase 310 (see FIG. 3) the photo sensor 220 is charged, i.e., reverse biased, by the voltage source $V_{DD}$, to a reset voltage level via the reset transistor 230. The actual voltage at the cathode terminal of the photo sensor 220 is $V_{DD}-V_{TN}$, where $V_{TN}$ is the voltage drop across the reset transistor 230. This charge voltage level is referred to as the "reference black" voltage level ($V_{RB}$).

Next, during an integration phase 330 (FIG. 3) the photo sensor 220 is exposed to incident light that is to be measured. As discussed above, photons striking the depletion region of the photo sensor 220, cause an increase in the reverse current flowing to the gate terminal of the source follower 240. The voltage of the remaining charge on the photo sensor 220 is proportional to the number of photons that strike the photo sensor 220. Thus, during the integration phase 330, the voltage on the gate of the source follower 240 drops. A white reference level is reached as the cathode terminal of the photo sensor 220 approaches the negative power supply voltage, in this case ground. A black level occurs when no photons are integrated, such that the photo sensor voltage essentially remains at the original reference black voltage level of $V_{RB}=V_{DD}-V_{TN}$.

Finally, during a readout phase 350 (see FIG. 3) the row select transistor 250 is activated such that the gate voltage of the source follower transistor 240 is measured by the sensor circuit 290. In one embodiment, measurement of the photo sensor voltage is performed using a correlated double sampling circuit. First, the integrated photo sensor voltage signal is sampled. Then the CMOS image sensor circuit 161 is reset and the reset voltage is sampled to obtain the reference black value. The desired signal representing the incident light is the difference between the integrated photo sensor voltage and the photo sensor reset voltage.

According to the teachings of the present invention, it is advantageous to separate the photo sensor 220 from the related circuitry such as the transistors illustrated in FIG. 2 and the sensor circuit 290. In this way, the fabrication processes required to optimize the characteristics of the photo sensor 220 can be employed during the fabrication of the photo sensor array. Similarly, the fabrication processes required to optimize the functionality of the related circuitry can be employed as the circuitry is fabricated. The two structures are then interconnected as taught by the present invention.

Flip chip interconnect technology employs the use of bead-like terminals formed on one surface of a chip or monolithic semiconductor device to bond the flip chip to another electronic device, such as a circuit board. The bead-like terminals, also referred to as bumps, serve both to mechanically secure the flip chip to the circuit board and electrically interconnect the flip chip circuitry to the circuit board conductor pattern.

Figure 4:
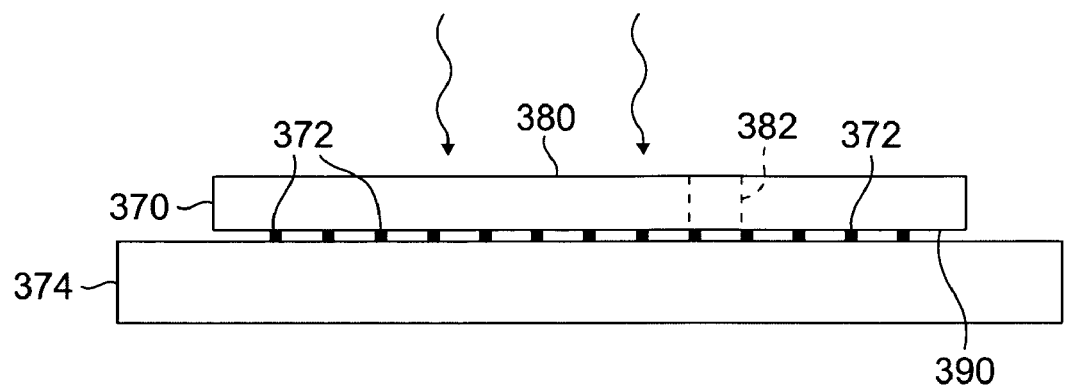
FIG. 4 is a cross-sectional view of first and second integrated circuit structures interconnected according to the teachings of the present invention.

Turning to FIG. 4 there is shown a cross-section of a CMOS image sensor array 370 having a plurality of bumps or terminals 372 bonded to a surface 390 of the CMOS image sensor array 370. The bumps 372 interconnect circuitry on the CMOS image sensor array 370 to signal processing circuits of an integrated circuit 374. In one embodiment, the integrated circuit 374 includes circuitry employing CMOS technology. Incident light is received by the CMOS image sensor array 370 at a surface 380 thereof. In one embodiment, the CMOS image sensor array includes the photo sensor diode 220 illustrated in FIG. 2, the location of which is shown generally by reference character 382. The remaining FIG. 2 components (and other circuit elements as needed) are fabricated into the integrated circuit 374.

Optical filters can be placed adjacent the incident surface of the CMOS image sensor array 370 (that is, the surface 380) to filter out specific wavelengths of light as determined by the characteristics of the filter. For example, a first plurality of photo sensors 220 in the CMOS image sensor array 370 can be made responsive to only red light by placement of a filter blocking other spectral colors on the surface 380. In a similar manner, other photo sensors 220 can be made to respond only to blue or green light by appropriate spectral filtering. Signals derived from the respective photo sensors representing the red, green and blue light intensities can be combined within the circuitry of the substrate 374 for producing a color signal.

In one embodiment, the pitch of the pixels of the CMOS image sensor array 370 is on the order of microns, and therefore to individually access each image sensor, the pitch of the connections, if configured to provide individual pixel access, must have the same pitch. In another embodiment of the present invention, adjacent or grouped pixels may be fabricated with different properties, for example each pixel in a group of n pixels may have an optimal frequency response to a selected wavelength. In such an embodiment it may not be necessary to access individual pixels, but instead, the group of n pixels can be accessed by a single interconnect bump. In yet another embodiment, the teachings of the present invention can be applied to a plurality of image sensors arranged in a line, rather than the two dimensional array illustrated in FIG. 1.

The array of bumps 372 can be formed using several different techniques, all presenting trade-offs between bump pitch, cost and fabrication simplicity. In one embodiment the bumps can be formed by a silk screening process or by the selective removal of a conductive material, typically using lithographic techniques. Familiar silk screening processes can also be used to form the bump array.

The bumps can also be selectively formed by electroplating or electrolessly over previously exposed metal or conductive regions in a semiconductor substrate. A mask, which is a transparent silica plate bearing the bump pattern, is used to expose the regions where the bumps are to be formed. The blank mask is coated with an ultraviolet light absorbing layer, such as iron oxide, making the entire mask opaque to ultraviolet light. A thin layer of electron beam sensitive resist material is placed on the plate and selective portions are exposed to an electron beam; the exposed portions undergo a chemical change. After exposure, the exposed portions of the resist are removed by developing in a chemical solution. The iron oxide material is then selectively etched from the mask in those regions where the exposed resist has been removed To prepare the integrated circuit, the surface 390 of the image sensor 370 is covered with an ultraviolet light-sensitive organic material, referred to as photoresist. The mask is then placed in contact with the photoresist-covered wafer and the assembly is exposed to ultraviolet light. The ultraviolet light shines through those portions of the mask devoid of iron oxide and acidifies the exposed photoresist. The image sensor array 370 is developed in a basic solution of sodium-hydroxide, causing the exposed photoresist to etch away. In this way, the pattern on the mask has been transferred to the surface 390. The remaining photoresist is cured through a heat process.

The bumps 372 are then formed in the patterned surface 390 by electroplating or electrodepositing a conductive material into the exposed areas. In the conventional electrodeposition technique, a quantity of metal (e.g., nickel) is accurately electrodeposited at the mask opening points. If solder is used as the material for the bumps, the solder is placed in the openings and heated above its melting temperature to form solder bumps. The final shape of the bumps is dependent on the techniques used to form them and the material of which they are composed. Solder bumps are characteristically hemispherical. Bumps deposited by electroplating or electrolessly are likely to have a rectangular cross section. After the bumps 372 are formed, the mask is removed and a corrosion inhibitor applied to the entire surface 390, including the bumps 372. For example, solder bumps are coated with gold to inhibit corrosion.

The type of bumps formed on the surface 390 also determine the technique employed to attach the bumps 372 to the substrate 374. When the bumps are formed of solder, a solder reflow attachment process is employed to electrically interconnect and securely bond the individual solder bumps 372 to the conductive pattern on the substrate 374. The re-flow process involves first registering the solder bumps 372 with their respective mating conductive areas on the substrate 374 and re-heating or re-flowing the solder so as to metallurgically bond and thereby electrically interconnect the solder bumps 372 with the corresponding conductors of the substrate 374. If the bump material is nickel, electrolessly or electrodeposited, a conductive adhesive, applied by a screen printing process, can be used to attach the two surfaces. An anisotropic adhesive (i.e., conductive in substantially one direction) can also be used. The adhesive is applied over the entire surface, but conducts only in the regions where a crushing force has been applied, as for instance, when the bump and its mating surface are brought into physical contact.

It may be necessary to polish down and etch back the surface 380 so that incident light can pass therethrough and reach the doped semiconductor regions forming the photo sensors 220. If the CMOS image sensor array 370 is fabricated using a silicon substrate material, then the CMOS image sensor array 370 responds to those frequencies to which silicon is transparent, i.e., wavelengths in the infrared segment of the spectrum. As is known to those skilled in the art, the band gap of the semiconductor material in which the photo sensors 220 are formed determines the wavelengths to which the semiconductor photo sensor 220 responds, and thus the frequency sensitivity of the CMOS image sensor array 370.

According to the teachings of the present invention, the interconnect structure illustrated in FIG. 4 accommodates individual access and control over each pixel element or photo sensor 220. As a result, optical special effects can be implemented in the photo sensor array 370. Also, anomalies in the fabrication process may create variations among the various photo sensors 220. In particular, slight variations in doping level can affect the output photo sensor voltage for identical incident light energy. After fabrication, the individual photo sensors can be calibrated with known incident light and thereafter the signal processing circuitry associated with each pixel can be designed to compensate for variations in output voltage for identical input incident light.

Figure 5:
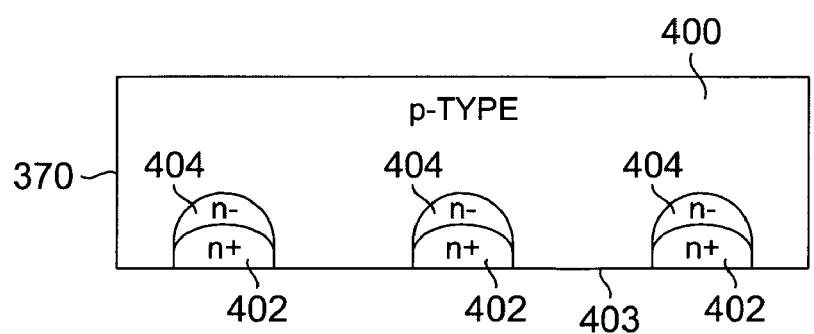
FIG. 5 illustrates doping regions for the CMOS image sensor circuit.

FIG. 5 illustrates three exemplary spaced-apart doped regions representative of the photo sensor 220. In particular, the an junctions comprise p-type substrate material 400 having spaced-apart n+ regions 402 and n− regions 404 formed therein along a surface 403. Use of the n− region affords a larger depletion region for the collection of incident photons. The same structure can be fabricated with an n-type substrate and p-type doped regions formed therein.

In addition to the CMOS image sensors as discussed above, the photo sensors of the present invention can also be implemented as Schottky-barrier diodes, metal-semiconductor-metal photodiodes, p-i-n diodes, avalanche photodiodes, and heterojunction phototransistors. Also, field-effect and bipolar junction devices can also be employed as the image sensors.

While the invention has been described with reference to a preferred embodiment, it will be understood by those skilled in the art that various changes may be made and equivalent elements may be substituted for the elements thereof without departing from the scope of the invention. The scope of the present invention further includes any combination of the elements from the various embodiments set forth herein. In addition, modifications may be made to adapt a particular situation to the teachings of the invention without departing from. In particular, the invention may be practiced in a variety of ways in a variety of circuit structures including structures formed with III–IV compounds and other semiconductor materials. Therefore, it is intended that the invention not be limited to the particular embodiments disclosed, but that the invention will include all other constructions, not expressly identified herein, which fall within the scope of the appended claims.

What is claimed is:

1. An image sensing and processing system, comprising:
a first integrated circuit comprising a plurality of image sensing elements responsive to electromagnetic radiation directed toward a first surface thereof and a plurality of first conductive interconnect elements disposed on a second surface thereof, wherein the plurality of image sensing elements further comprise elements selected responsive to the image sensing functionality of the first integrated circuit; and
a second integrated circuit comprising a plurality of image signal processing elements and a plurality of second conductive interconnect elements formed on a surface thereof and in electrical communication with the pluraliy of first conductive interconnect elements, wherein the plurality of image signal processing elements further comprise elements selected responsive to the image signal processing functionality of the second integrated circuit and wherein a pitch of the plurality of first interconnect elements is equal to a pitch of the plurality of second interconnect elements.

2. An image sensing and processing system, comprising:
a first integrated circuit comprising a plurality of image sensing elements responsive to electromagnetic radiation directed toward a first surface thereof and a plurality of first conductive interconnect elements disposed on a second surface thereof, wherein the plurality of image sensing elements further comprise elements selected responsive to the image sensing functionality of the first integrated circuit, and wherein the first integrated circuit comprises a semiconductor substrate of a first conductivity type and a plurality of spaced apart doped semiconductor regions of a second conductivity type formed in a surface of the semiconductor substrate, and wherein a reverse bias potential is applied to the semiconductor substrate and the doped regions to create a depletion region therebetween; and a second integrated circuit comprising a plurality of image signal processing elements and a plurality of second conductive interconnect elements formed on a surface thereof and in electrical communication with the plurality of first conductive interconnect elements, wherein the plurality of image signal processing elements further comprise elements selected responsive to the image signal processing functionality of the second integrated circuit.

* * * * *